(12) United States Patent
Itabashi et al.

(10) Patent No.: US 6,185,101 B1
(45) Date of Patent: Feb. 6, 2001

(54) ELECTRONIC CIRCUIT APPARATUS AND METHOD FOR ASSEMBLING THE SAME

(75) Inventors: Toru Itabashi, Anjo; Toshiaki Yagura, Nukata-gun; Kazuya Sanada, Kariya; Yukihide Niimi, Chita-gun, all of (JP)

(73) Assignee: Denso Corporation, Kariya (JP)

( * ) Notice: Under 35 U.S.C. 154(b), the term of this patent shall be extended for 0 days.

(21) Appl. No.: 09/172,623

(22) Filed: Oct. 15, 1998

(30) Foreign Application Priority Data

Dec. 24, 1997 (JP) .................................................. 9-355775
Dec. 25, 1997 (JP) .................................................. 9-355965

(51) Int. Cl.⁷ .................................................. H05H 7/20
(52) U.S. Cl. .......................... 361/704; 361/707; 361/708; 361/710; 361/715; 361/720
(58) Field of Search .................. 174/16.3, 252; 257/723–724; 361/688, 690, 704–711, 708, 715–716, 719–721; 422/109; 439/79

(56) References Cited

U.S. PATENT DOCUMENTS

| 4,203,147 | * | 5/1980 | Gabr ..................................... 361/704 |
| 4,803,590 |   | 2/1989 | Fassel et al. . |
| 4,808,115 | * | 2/1989 | Norton et al. .......................... 439/79 |
| 4,963,414 | * | 10/1990 | LeVasseur et al. ................... 428/901 |
| 5,050,039 | * | 9/1991 | Edfors ................................... 361/707 |
| 5,060,112 |   | 10/1991 | Cocconi . |
| 5,396,404 |   | 3/1995 | Murphy et al. . |
| 5,432,678 |   | 7/1995 | Russell et al. . |

FOREIGN PATENT DOCUMENTS 8-23184  1/1996 (JP) .
8-111575 4/1996 (JP) .

OTHER PUBLICATIONS

Patent Abstracts of Japan; vol. 1996, No. 08, Aug. 30, 1996 & JP 08 111575 A (Nissan Motor Co., Ltd.), Apr. 30, 1996 *Abstract*.
Patent Abstracts of Japan; vol. 010, No. 248, Aug. 26, 1986 & JP 61 077349 A (Fujitsu Ltd.), Apr. 19, 1986 *Abstract*.

* cited by examiner

*Primary Examiner*—Gregory Thompson
(74) *Attorney, Agent, or Firm*—Pillsbury Madison & Sutro LLP

(57) ABSTRACT

A plurality of ceramic circuit boards mounted with heat-generative driving transistors and other electronic parts are bonded to a heat radiating fin, and the heat radiating fin is connected to a motherboard. Heat generated by the driving transistors can efficiently be absorbed and dissipated by the heat radiating fin, and assembling work necessary for combining the components to the motherboard can be reduced. The electronic parts, wiring patterns and the like on the circuit boards can simultaneously be encapsulated in a resin or the like after bonding the circuit boards to the heat radiating fin, packaging work can be reduced.

17 Claims, 10 Drawing Sheets

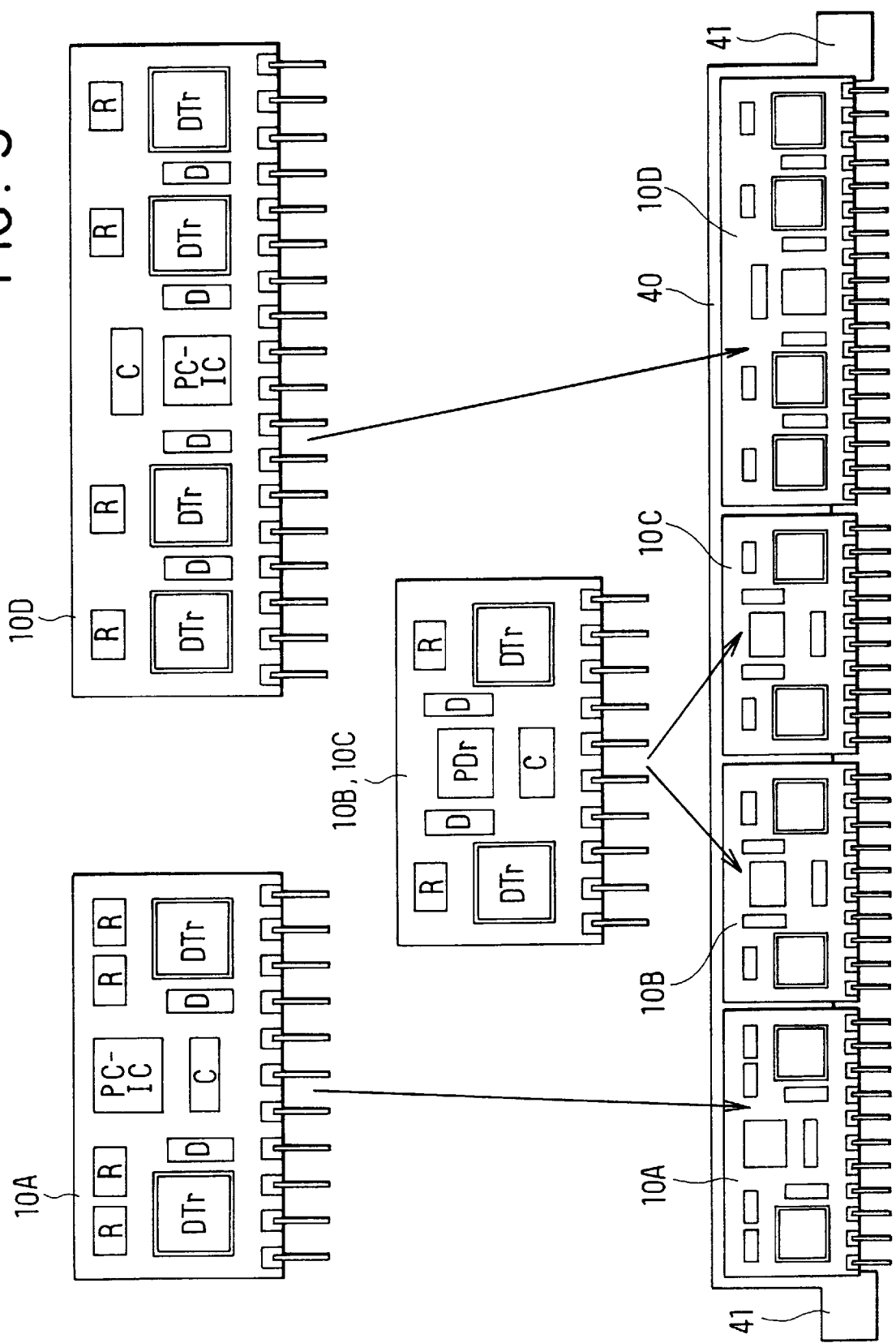

ELECTRONIC CIRCUIT APPARATUS AND METHOD FOR ASSEMBLING THE SAME

CROSS REFERENCE TO RELATED APPLICATION

This application relates to and incorporates herein by reference Japanese Patent Applications No. 9-355775 file on Dec. 24, 1997 and No. 9-355965 filed on Dec. 25, 1997.

BACKGROUND OF THE INVENTION

1. Field of the Invention

The present invention relates to an electronic circuit apparatus having a plurality of circuit boards (substrates) mounting a plurality of electronic parts thereon, and a motherboard joined to the circuit boards, and a method for assembling such an electronic circuit apparatus. More particularly, the present invention relates to an electronic circuit apparatus capable of efficiently dissipating heat generated by power devices, and requiring reduced work for assembling the same.

2. Related Art

In a conventional electronic circuit apparatus such as disclosed in JP-A-8-111575, semiconductor chips are mounted directly on a circuit board. Positioning pins attached to the circuit board are inserted in holes formed in a motherboard to connect the circuit board and the motherboard. The circuit board is made of a metal to dissipate heat generated by power devices.

If this apparatus has a plurality of circuit boards to achieve many functions, the motherboard needs an increased number of holes for receiving the positioning pins of the circuit boards. The holes reduce a space available for mounting electronic parts on the motherboard. Assembling the circuit boards with the motherboard requires increased man-hours. Furthermore, heat generated by the power devices on the circuit boards cannot be absorbed nor dissipated efficiently, because the circuit boards are provided individually with heat radiating fins (heat sinks).

SUMMARY OF THE INVENTION

It is therefore an object of the present invention to provide an electronic circuit apparatus capable of reducing space necessary for mounting on a motherboard a plurality of circuit boards mounted with a plurality of electronic parts thereon.

It is another object of the present invention to provide an electronic circuit apparatus capable of efficiently absorbing and dissipating heat generated by power devices mounted on a plurality of circuit boards.

It is a still another object of the present invention to reduce man-hours necessary for mounting a plurality of circuit boards on a motherboard.

In an electronic circuit apparatus according to one aspect of the present invention, a plurality of circuit boards having a plurality of electronic parts including heat-generative electronic parts thereon are joined to a heat radiating member. A motherboard is connected to the circuit boards. Heat generated by the heat-generative electronic parts on the circuit boards can efficiently be absorbed and radiated by the heat radiating member, and assembling the circuit board and the motherboard requires reduced man-hours. The electronic parts on the circuit boards and wiring patterns may be sealed simultaneously in a resin for packaging after bonding the circuit boards to the heat radiating member, thus requiring reduced man-hours for packaging.

In assembling the electronic circuit apparatus, the circuit boards are bonded to the heat radiating member, and then the heat radiating member is assembled on the motherboard.

In an electronic circuit apparatus according to another aspect of the present invention, a plurality of circuit boards mounted with a plurality of electronic parts are joined to a motherboard. A case has walls projecting toward the motherboard surrounds at least a part of a region in which the electronic parts are disposed. Thus, the efficiency of heat transfer from the electronic parts on the circuit boards to the case can be improved. The walls shield incoming noise to maintain the electronic circuits to be noise-resistant.

BRIEF DESCRIPTION OF THE DRAWINGS

Other objects, features and advantages of the present invention will become more apparent from the following detailed description made with reference to the accompanying drawings. In the drawings:

FIG. 3 is a schematic view showing an arrangement of a plurality of circuit boards on a heat radiating fin in the electronic circuit apparatus shown in FIG. 1;

DETAILED DESCRIPTION OF THE PREFERRED EMBODIMENTS

Figure 1:
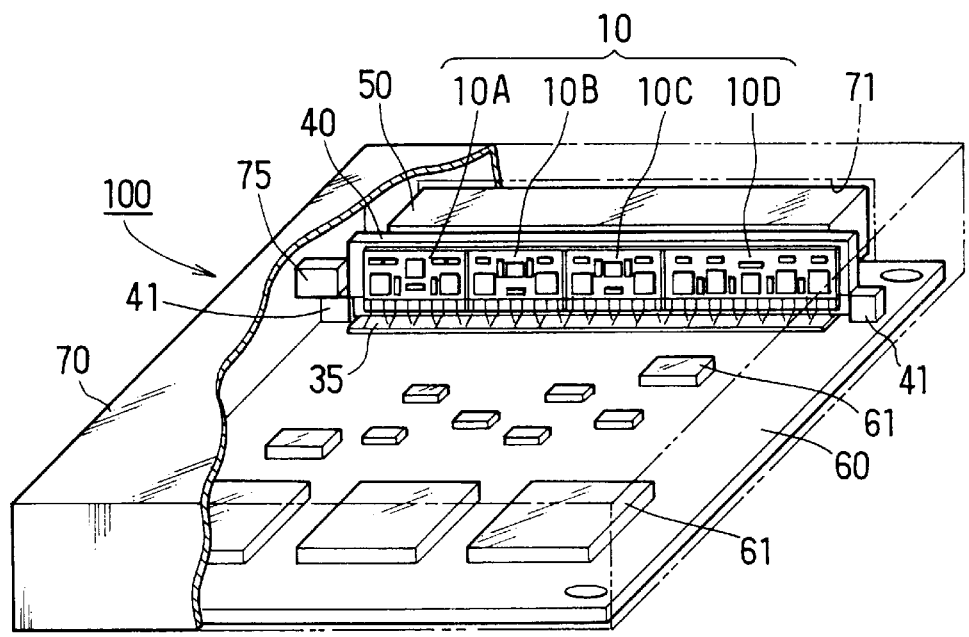
FIG. 1 is a perspective view showing an electronic circuit apparatus according to a first embodiment of the present invention.

The present invention will be described in more detail with reference to various embodiments in which the same or like parts are denoted by the same or like reference numerals.

First Embodiment

Figure 2:
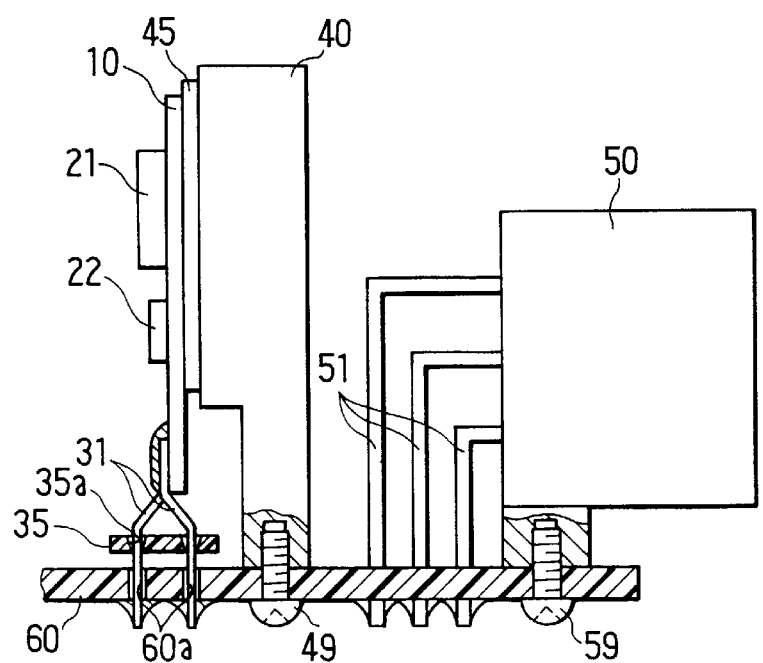
FIG. 2 is a fragmentary sectional view showing a part of the electronic circuit apparatus shown in FIG. 1.

Referring first to FIGS. 1–3, an electronic circuit apparatus 100 has a plurality of thick film type ceramic circuit boards 10A, 10B, 10C and 10D, i.e., ceramic circuit boards for thick films, capable of highly efficient heat radiation. The circuit boards 10A, 10B, 10C and 10D have different control functions, respectively. The circuit boards 10A, 10B, 10C and 10D are designated inclusively as circuit boards 10.

Each of the circuit boards 10 is provided with at least one driving transistor (power transistor) 21, i.e., a heat-generative power device, and other electronic parts 22 such as resistors and capacitors. The circuit boards 10 are bonded to a heat radiating fin 40 made of aluminum or the like to absorb and dissipate heat generated by the driving transistor 21 with adhesive films 45 having a high thermal conductivity such as a silicone adhesive.

Terminals 31 arranged on the circuit boards 10 for electrical connection are inserted in corresponding holes 60a formed in a motherboard 60 through an insulating terminal arraying member 35 and are soldered to terminals arranged on the motherboard 60. The motherboard 60 has other electronic circuit devices 61 mounted thereon. The terminal arraying member 35 is provided with a plurality of taper holes 35a at positions corresponding to the positions of the terminals 31 of the circuit boards 10. The arrangement of the terminals 31 and the state of holding the terminals 31 are ensured by inserting the terminals 31 of the circuit boards 10 in the holes 35a of the terminal arraying member 35. Therefore, the positional relation between the holes 60a formed in the motherboard 60 and the terminals 31 of the circuit boards 10 can be ensured, and the terminals 31 of the circuit boards 10 can easily be inserted in the holes 60a of the motherboard 60.

The heat radiating fin 40 to which the circuit boards 10 are bonded is fixed to the motherboard 60 with screws 49. A connector unit 50 is fixed to the motherboard 60 with screws 59 at a position near one side of the motherboard 60. Terminals 51 of the connector unit 50 are electrically connected to the terminals of the motherboard 60 by soldering. The motherboard 60 thus mounted with the heat radiating fin 40 and the connector unit 50 is contained in a case 70 made of a material having a high thermal conductivity, such as aluminum, and a cover, not sown, made of aluminum or the like is fastened to the case 70 with screws to complete the electronic circuit apparatus 100.

The case 70 has lateral protrusions 75 on its inner surface. The protrusions 75 are in contact respectively with lateral protrusions 41 formed at the opposite ends of the heat radiating fin 40 to transfer heat from the heat radiating fin 40 to the case 70 and to radiate the heat from the case 70. Only a side of connecting terminals of the connector unit 50 fixed to the motherboard 60 is exposed outside through an opening 71 formed in the case 70.

In this electronic circuit apparatus 100, the heat radiating fin 40 is disposed inside the case 70 substantially in parallel with the connector unit 50 in a position like a screen. The interior of the electronic circuit apparatus 100 is electromagnetically shielded by the case 70, the cover (not shown) and the heat radiating fin 40, all being made of aluminum or the like and disposed on the side of the opening 71.

Thus, in the electronic circuit apparatus 100, all the circuit boards 10 mounted with the electronic parts 21 and 22 are joined to the single heat radiating fin 40, and the heat radiating fin 40 is fastened to the motherboard 60. Therefore, heat generated by the driving transistors 21 mounted on the circuit boards 10 can efficiently be absorbed and dissipated by the heat radiating fin 40, and work necessary for combining the circuit boards 10 with the motherboard 60 can be reduced. Since the electronic parts 21 and 22 mounted on the circuit boards 10, and wiring patterns formed on the circuit boards 10 can be encapsulated in a resin or the like for packaging after bonding the circuit boards 10 to the heat radiating fin 40, work necessary for packaging can be reduced.

The electronic circuit apparatus 100 in this embodiment has the case 70 containing the motherboard 60, and the protrusions 75 formed on the case 70 are in contact with or bonded to the protrusions 41 formed on the heat radiating fin 40 to transfer heat generated by the driving transistors 21 through the heat radiating fin 40 to the case 70. That is, heat generated by the driving transistors 21 is transferred through the heat radiating fin 40 to the case 70. Consequently, the case 70 having a large heat capacity serves as a heat radiating member, so that heat generated by the driving transistors 21 can efficiently be absorbed and dissipated.

The electronic circuit apparatus 100 is provided with the connector unit 50 for electrically connecting the motherboard 60 to external wiring, and the connector unit 50 is disposed near the heat radiating fin 40. Thus, the distances between the driving transistors 21 mounted on the circuit boards 10 and the connector unit 50 can be reduced to the least possible extent, so that high current flowing in the power transistors 21 can efficiently flow to the connector unit 50. If leads are formed near the connector unit 50 on the motherboard 60 so as to match with the position of the heat radiating fin 40 holding the circuit boards 10 near the connector unit 50, parts in those range can be soldered by flow soldering, and parts outside those ranges can be soldered by reflow soldering. Therefore, lands of parts surface-mounted on the motherboards 60 may be small and packaging density can be increased.

The electronic circuit apparatus 100 has a terminal arraying member 35 provided with holes 35a arranged so as to correspond to the terminals 31 of the circuit boards 10 (10A, 10B, 10C, 10D), and the terminals 31 are extended through the terminal arraying member 35 and are electrically connected to the motherboard 60. The positional relation between the terminals 31 and the holes 60a of the motherboard 60 can be ensured by inserting the terminals 31 of the circuit boards 10 in the holes 35a of the terminal arraying member 35, so that the terminals 31 of the circuit boards 10 can easily be inserted in the holes 60a of the motherboard 60.

The electronic circuit apparatus 100 has the circuit boards 10 (10A, 10B, 10C, 10D) made of a material capable of highly efficient heat radiation and prevalently used for forming thick film circuit boards. Therefore, heat generated by the driving transistor 21 mounted on the circuit boards 10 can efficiently be transferred to the heat radiating fin 40 and hence temperature rise in the driving transistors 21 can be suppressed.

The circuit boards 10 are designed for specific control functions. For example, if the electronic circuit apparatus 100 is for an engine control, the circuit board 10A may have a power supply control circuit for the electronic circuit apparatus 100, the circuit boards 10B and 10C may have fuel injection control circuits, and the circuit board 10D may have a motor control circuit for controlling a d.c. motor for operating a throttle. The control circuits are provided with necessary electronic parts such as driving transistors (DTr), power control integrated circuits (PC-IC), pre-driver (PDr), resistors (R), diodes (D) and capacitors (C). The circuit boards 10 are disposed at predetermined positions, respectively, on the heat radiating fin 40 and are bonded to the heat radiating fin 40 with the adhesive films 45.

Figure 4A:
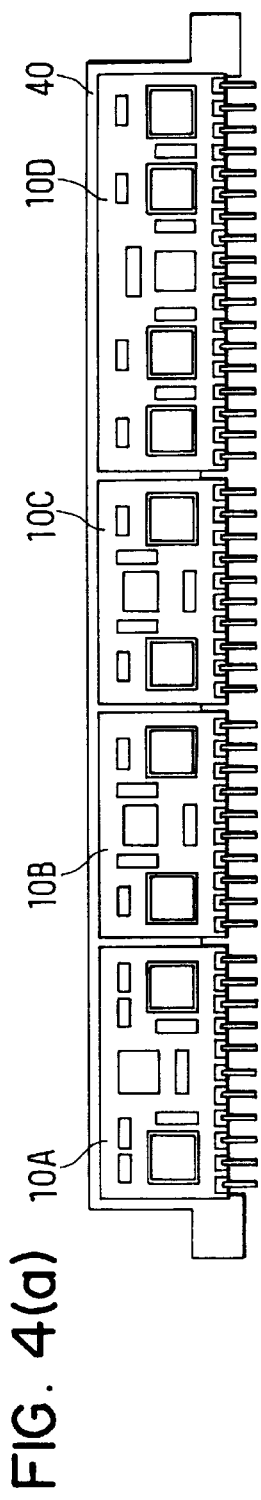
FIGS. 4(a), 4(b) and 4(c) are schematic views of modified arrangements of the circuit board in the electronic circuit apparatus shown in FIG. 1.
Figure 4B:
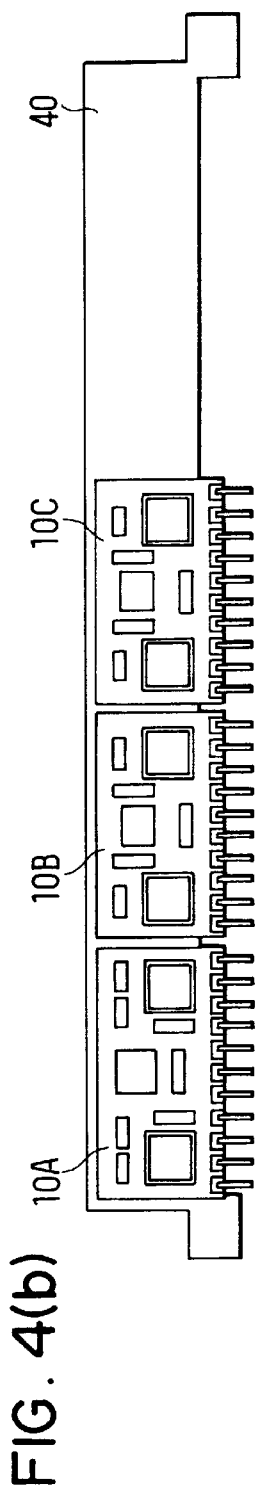
Figure 4C:
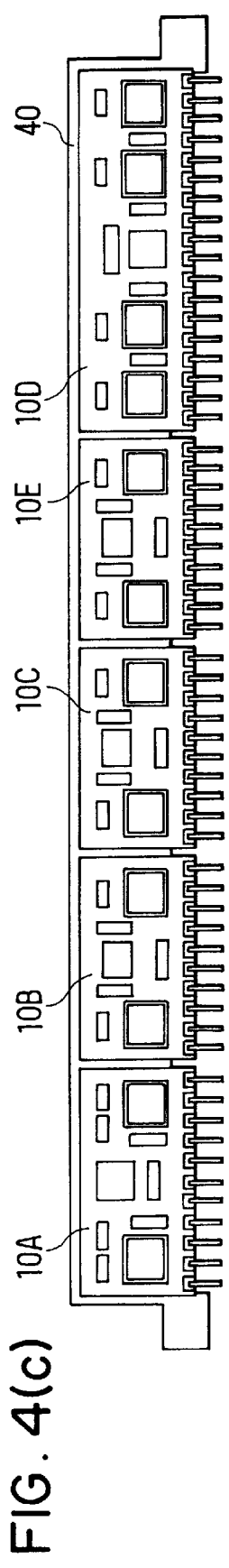

Since the circuit boards 10 are assigned to specific control operations, respectively, circuit boards having different control functions desired in a vehicle may be bonded to the heat radiating fin 40 as shown in FIGS. 4(a), 4(b) and 4(c). An assembly shown in FIG. 4(a) can be used for controlling a four-cylinder internal combustion engine requiring the circuit board 10A provided with a power supply control circuit, the circuit boards 10B and 10C provided with fuel injection control circuits, and the circuit board 10D provided with the motor control circuit. An assembly shown in FIG. 4(b) can be used for controlling a four-cylinder internal combustion engine requiring the circuit board 10A provided with the power supply control circuit and the circuit boards 10B and 10C provided with the fuel injection control circuits, and not requiring the circuit board 10D provided with the motor control circuit. Thus, only the necessary ones of the circuit boards 10 (10A, 10B, 10C, 10D) are bonded to the heat radiating fin 40. Therefore, the heat radiating fin 40, the motherboard 60 and the case 70 can be used as common parts for constructing various assemblies.

Since the circuit boards 10 are constructed for the specific control functions, respectively, an assembly shown in FIG. 4(c) for controlling a six-cylinder internal combustion engine can be formed by adding another circuit board 10E provided with a fuel injection control circuit to the assembly shown in FIG. 4(a) and using a heat radiating fin 40 having a larger heat radiating fin 40. Since the circuit boards 10 (10A, 10B, 10C, 10D, 10E) are capable of specific control functions assigned thereto, respectively, the circuit boards 10 can selectively be used in combination to construct an assembly having control functions required by a vehicle, and the use of the parts as common parts can easily be achieved.

Since the circuit boards 10 are capable of specific control functions, respectively, an assembly meeting conditions required by a vehicle can be formed by bonding only the circuit boards 10 capable of control functions required by the vehicle to the heat radiating fin 40. Only the necessary ceramic circuit boards 10 are bonded to the heat radiating fin 40 to use the heat radiating fin 40 as a common part. The motherboard 60 and the case 70 can be used as common parts.

Figure 5:
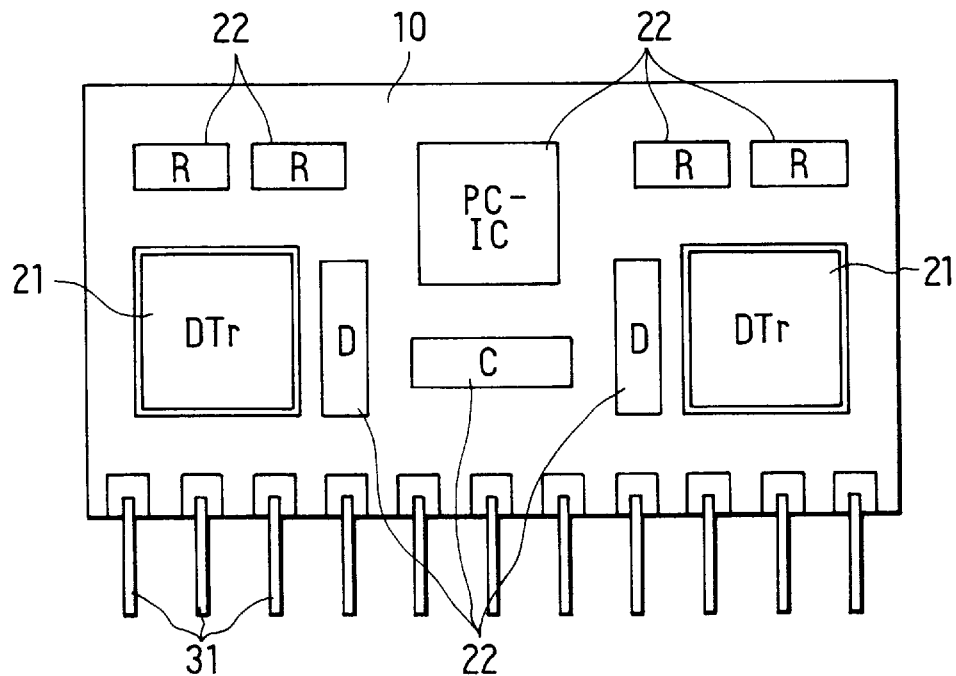
FIG. 5 is a schematic view of the circuit board in the electronic board shown in FIG. 1.

In this embodiment, as shown in FIG. 5, each circuit board 10 has a circuit including the driving transistors (DTr) 21 for driving a controlled system, and the other electronic parts (PC-IC, C, D, R) 22 for controlling the driving transistors 21. Since the circuit boards 10 are provided with individual circuits including the power devices, respectively, an assembly meeting desired functions can easily be formed by bonding the selected circuit boards 10 having desired control functions among the circuit boards 10 to the heat radiating fin 40, and the motherboard 60 can be used as a common part.

Figure 6:
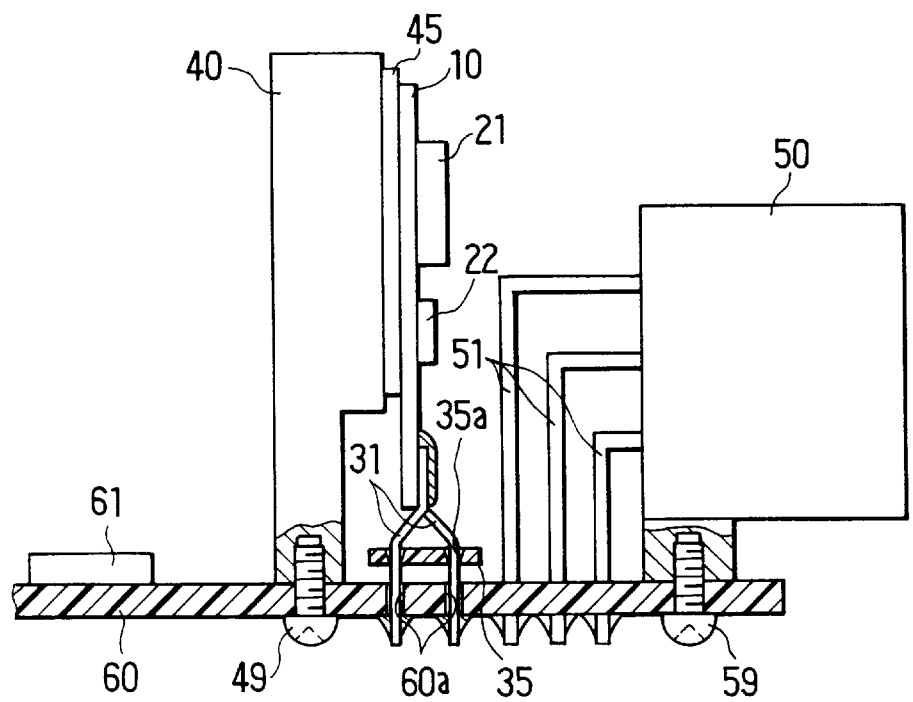
FIG. 6 is a fragmentary sectional view of a part of an electronic circuit apparatus according to a modification of the first embodiment of the present invention.

In a modification shown in FIG. 6, the circuit boards 10 are bonded to a surface of the heat radiating fin 40 facing the connector unit 50 so that the circuit boards 10 are disposed to face the connector unit 50. The heat radiating fin 40 is disposed substantially in parallel with the connector unit 50 in a position like a screen. The circuit boards 10 are bonded to the heat radiating fin 40 so that the driving transistors (power transistors) 21 and the other electronic parts 22 mounted thereon face the connector unit 50. When the circuit boards 10 are thus bonded to the heat radiating fin 40, the radiation of heat generated by the driving transistors 21 on the motherboard 60 can be prevented and temperature rise in the electronic parts 61 can be reduced.

In the electronic circuit apparatus 100, the heat radiating fin 40 is disposed substantially in parallel with the connector unit 50 with the circuit boards 10 (10A, 10B, 10C, 10D) bonded thereto facing the connector unit 50. Therefore, radiant heat generated by the driving transistors 21 mounted on the circuit boards 10 is not transferred directly to the electronic parts 61 arranged on the motherboard 60 on the side of the surface of the heat radiating fin 40 opposite the side of the same to which the circuit boards 10 are bonded. Consequently, temperature rise in the case 70 can be suppressed.

Figure 7:
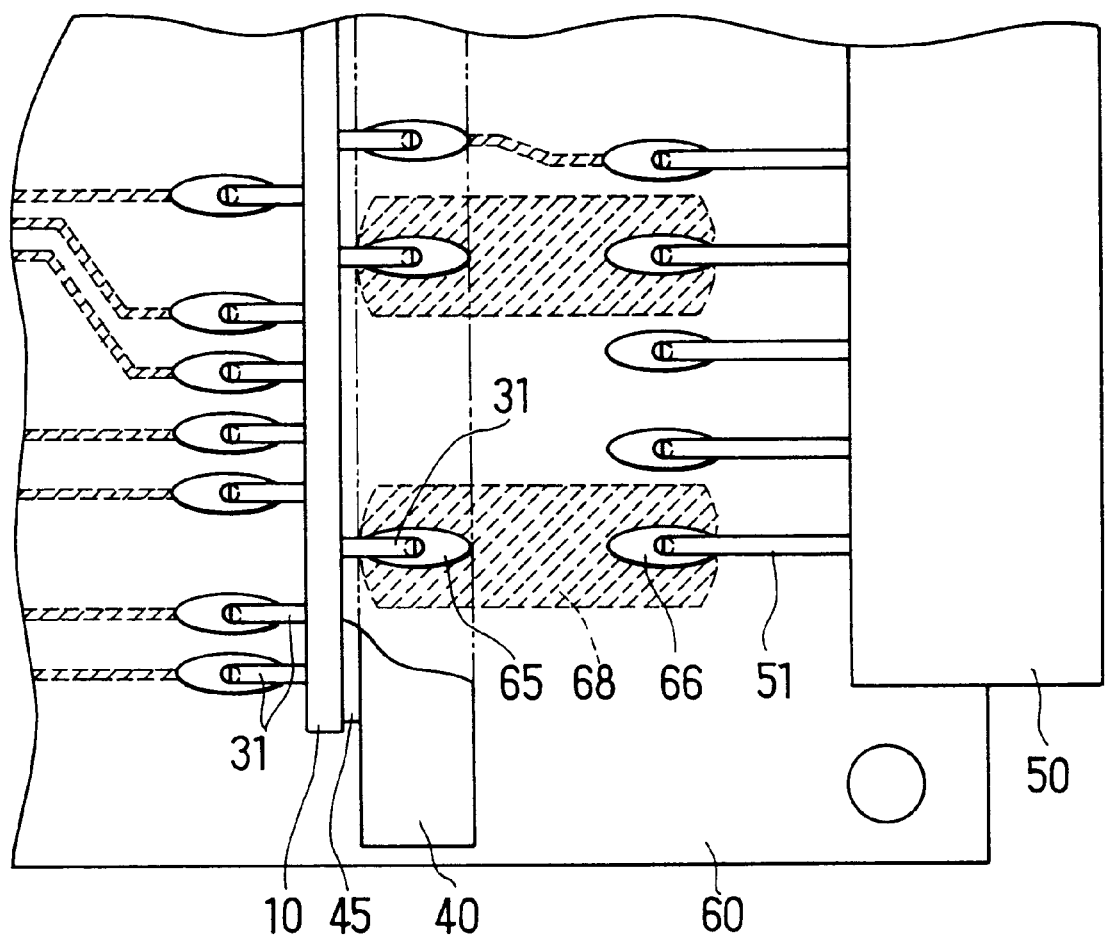
FIG. 7 is a fragmentary plan view showing a wiring pattern formed on a motherboard in an electronic circuit apparatus according to another modification of the first embodiment of the present invention.

In another modification shown in FIG. 7, the surface of the motherboard 60 provided with the wiring pattern is coated with an insulating film. In this figure, broken lines indicate portions of the wiring pattern underlying the insulating film, and solid lines indicate lands.

When the driving transistor 21 mounted on the circuit board 10 is connected electrically to an external controlled device (not shown), such as a d.c. motor, through the connector unit 50, generally, lines of the wiring pattern must be formed in a great thickness as compared with the magnitude of a driving current. Appropriate intervals must be secured between the adjacent terminals 31 arranged on the circuit board 10. In this embodiment, only the terminals 31 of the circuit board 10 to be connected to the connector unit 50 are bent toward the connector unit 50, and the rest of the terminals 31 of the same are bent in the opposite direction. Consequently, lands 65 formed on the surface of the motherboard 60 and connected to the circuit board 10, and lands 66 connected to terminals 51 of the connector unit 50 can be connected electrically by a wide, short conductive lines 68, i.e., power lines for a high current. The terminals 31 and 51 can be positioned at a short interval.

Figure 8:
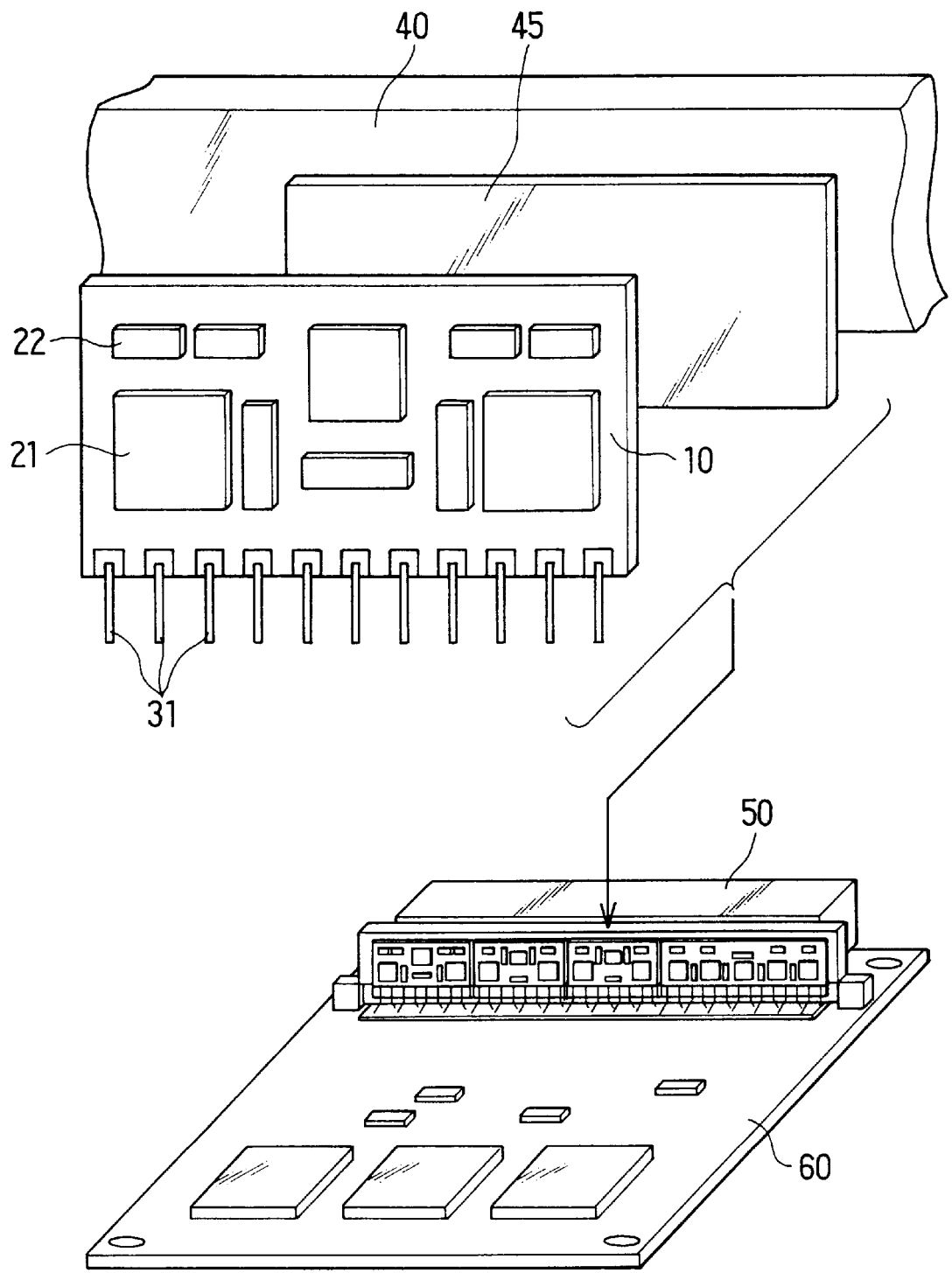
FIG. 8 is an exploded perspective view showing a method of assembling the circuit boards and heat radiating fin with the motherboard according to the first embodiment of the present invention.

The above electronic circuit apparatus 100 may be assembled as shown in FIG. 8, in which the terminal arraying member 35 and the case 70 are not shown. The circuit boards 10 mounted with the electronic parts including the heat-generative electronic parts are bonded to the heat radiating fin 40 with the adhesive films 45, thus providing an integral unit. Then, the terminals 31 of the circuit boards 10 bonded to the heat radiating fin 40 are inserted in the corresponding holes 60a of the motherboard 60, and the heat radiating fin 40 is fastened to the motherboard 60 with the screws 49. The terminals 31 of the circuit boards 10 are soldered to the lands of the motherboard 60 to connect electrically the circuit boards 10 to the motherboard 60. Thus, the circuit boards 10 can be inserted simultaneously in the motherboard 60 in a reduced assembling time, which improves productivity.

Figure 9:
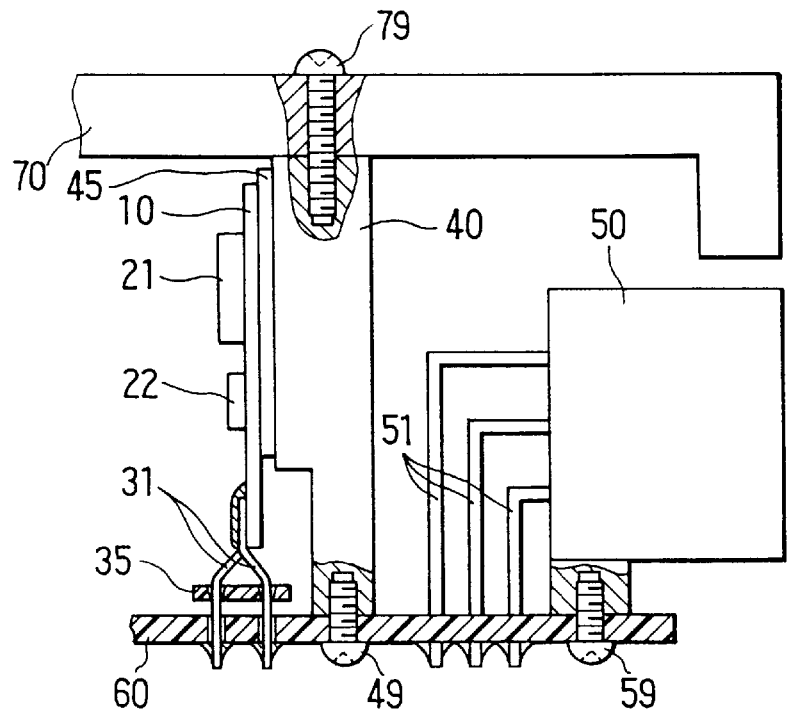
FIG. 9 is a fragmentary sectional view showing one method of connecting the heat radiating fin and the case in the first embodiment of the present invention.
Figure 10:
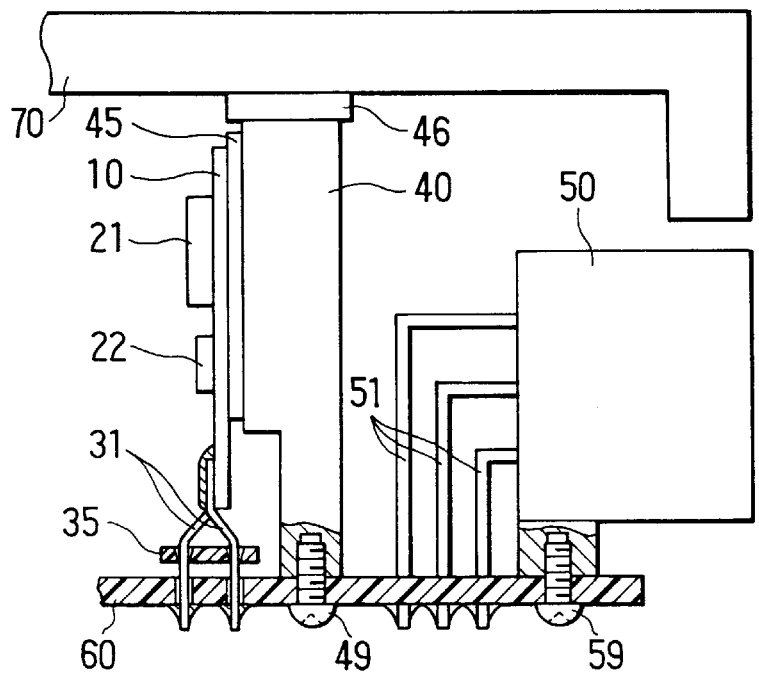
FIG. 10 is a fragmentary sectional view showing another method of connecting the heat radiating fin and the case in the first embodiment of the present invention.

The heat radiating fin 40 and the case 70 of the electronic circuit apparatus 100 may be assembled as shown in FIGS. 9 and 10. In FIG. 9, the heat radiating fin 40 is disposed in contact with the case 70 and is fastened with screws 79 to the case 70. Heat generated by the driving transistors 21 on the circuit boards 10 is transferred efficiently through the circuit boards 10, the adhesive films 45 and the heat radiating fin 40 to the case 70 and is radiated from the case 70. In FIG. 10, a heat-conductive sheet 46 is held between the heat radiating fin 40 and the case 70. Heat generated by the driving transistors 21 on the circuit boards 10 is transferred efficiently through the circuit boards 10, the adhesive films 45, the heat radiating fin 40 and the heat-conductive sheet 46 to the case 70 and is radiated from the case 70. Since this construction does not need work for fastening the heat radiating fin 40 to the case 70 with the screws (FIG. 9), the assembling work is improved further.

Second Embodiment

Figure 11:
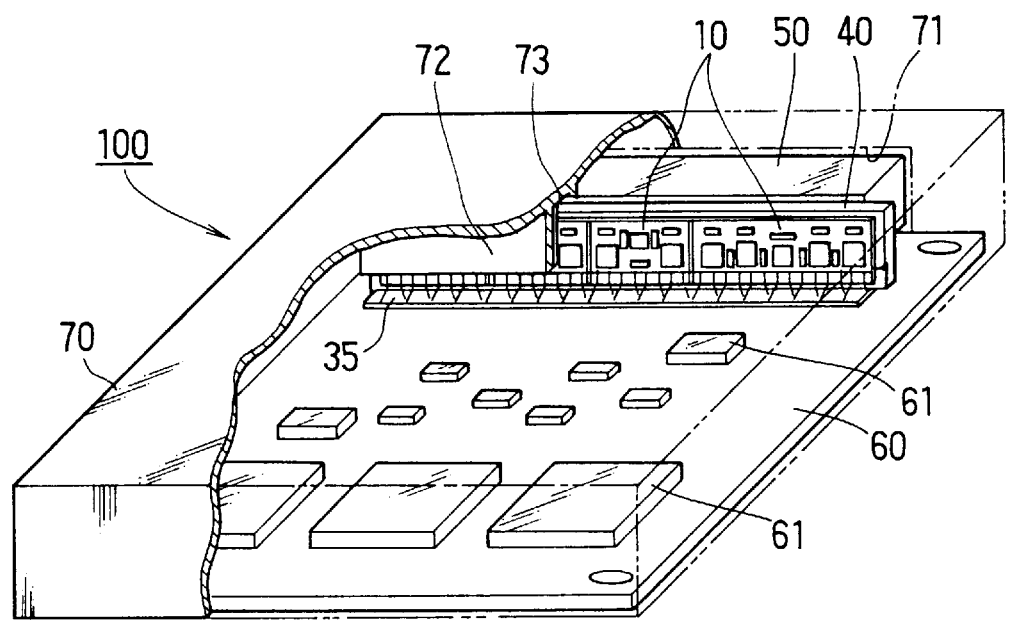
FIG. 11 is a perspective view showing an electronic circuit apparatus according to a second embodiment of the present invention.
Figure 12:
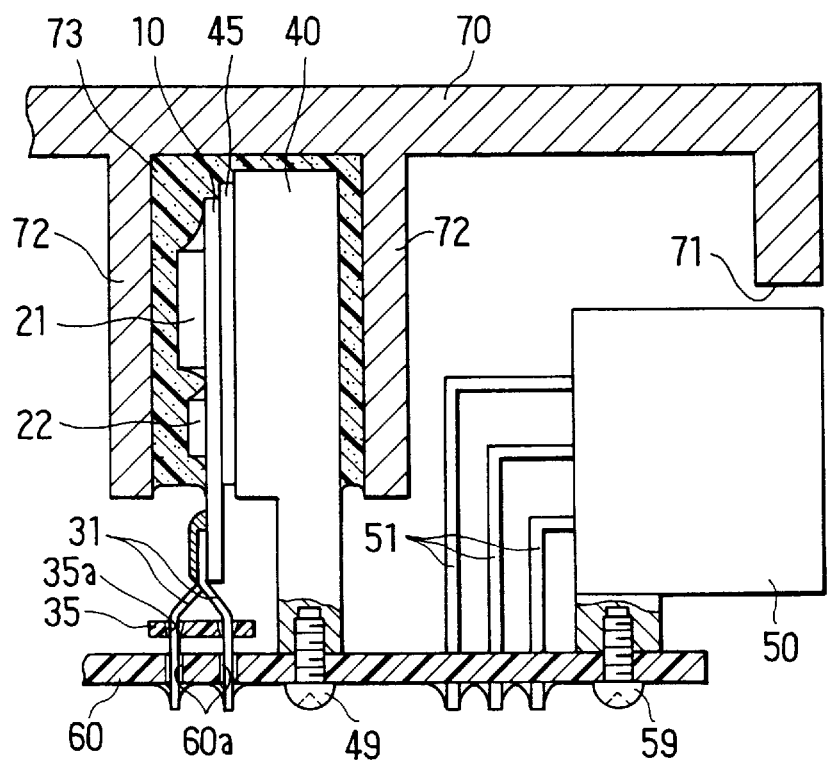
FIG. 12 is a fragmentary sectional view of a part of the electronic circuit apparatus shown in FIG. 11.

In this embodiment shown in FIGS. 11 and 12, the case 70 has walls 72 projected from the inner surface of the top wall of the case 70 toward the motherboard 60 to define a groove opening toward the motherboard 60. The walls 72 defines a mounting space in which the driving transistors 21 and the electronic parts 22 are mounted on the circuit boards 10 bonded to the heat radiating fin 40 in a position perpendicular to the motherboard 60 of the electronic circuit apparatus 100. Spaces between the inner surface of the wall 72 and the electronic parts 21 and 22 and between the inner surface of the other wall 72 and the bare surface of the heat radiating fin 40 are filled up with a heat-conductive silicone resin 73.

The heat-conductive resin 73 is a fluidic gel in its initial state. A predetermined quantity of the fluidic heat-conductive resin 73 is poured first in the groove defined by the walls 72. Next, the heat radiating fin 40 integral with the circuit boards 10 are inserted into the groove defined by the walls 72, and then the heat-conductive resin is thermally set to package the electronic parts 21 ad 22, the circuit boards 10 and the heat radiating fin 40 in the heat-conductive resin as shown in FIG. 12. Heat generated by the driving transistors 21 is transferred through the circuit boards 10 and the heat radiating fin 40 and the heat-conductive resin 73 or directly through the heat-conductive resin 73 to the walls 72. Heat is further transferred from the walls 72 to the case 70 having a large heat capacity, and is absorbed by and radiated from the case 70.

At least certain area of the circuit boards 10 in which the electronic parts 21 and 22 are arranged are surrounded by the walls 72 projecting from the case 70. Accordingly, the efficiency of heat transfer from the electronic parts 21 and 22 mounted on the circuit boards 10 to the case 70 can be improved. Since the driving transistors 21 are covered with the walls 72 projecting from the case 70, the electronic circuit apparatus has excellent noise resistance.

Further, since the circuit boards 10 are not directly fixed to the case 70, stresses which may be induced in the terminals 31 of the circuit boards 10, and the motherboard 60 when assembling the electronic circuit apparatus 100, when the electronic circuit apparatus 100 is subjected to a heat cycle or when the electronic circuit apparatus 100 vibrates can be reduced. Since the walls 72 are disposed near the connector unit 50, the distances between the driving transistors 21 mounted on the circuit boards 10 and the connector unit 50 can be reduced to the least possible extent. Accordingly, high current flowing in the driving transistors 21 can efficiently flow to the connector unit 50. Since the walls 72 projecting from the case 70 lie near the connector unit 50, external noise, such as electromagnetic waves, infiltrating through the connector unit 50 into the electronic circuit apparatus 100 can be screened.

Figure 13:
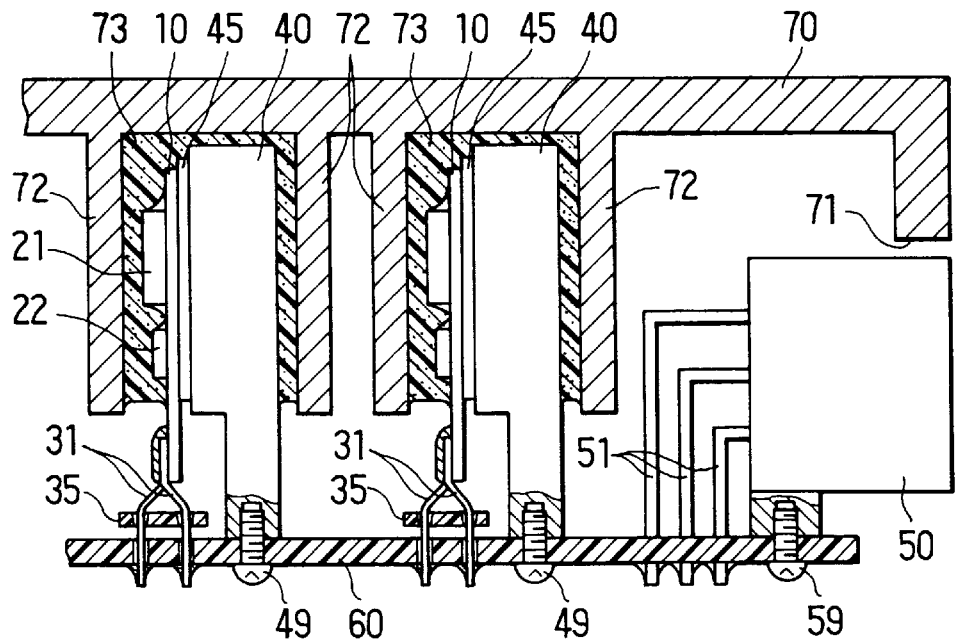
FIG. 13 is a fragmentary sectional view of a part of an electronic circuit apparatus according to a modification of the second embodiment of the present invention.

In a modification of the second embodiment, as shown in FIG. 13, the circuit boards 10 bonded to heat radiating fins 40 are arranged in two banks. Work necessary for mounting the circuit boards 10 on the motherboard 60 can be reduced by bonding the circuit boards 10 to each heat radiating fin 40. When the number of the circuit boards 10 is large, all the circuit boards 10 cannot be mounted on the one heat radiating fin 40 disposed near the connector unit 50, and a plurality of heat radiating fins 40 are necessary. There is no any restriction on the number of the circuit boards 10 on the heat radiating fin 40. The number of walls 72 projecting from the case 70 is dependent on the number of the heat radiating fins 40 to which the circuit boards 10 are bonded, and the walls 72 are formed so as to correspond to the heat radiating fins 40 to which the circuit boards 10 are bonded. Spaces defined by the walls 72 are filled beforehand with the heat-conductive resin 73, and the heat radiating fins 40 to which the circuit boards 10 mounted with the electronic parts 21 and 22 are inserted in spaces to complete assembling.

Figure 14:
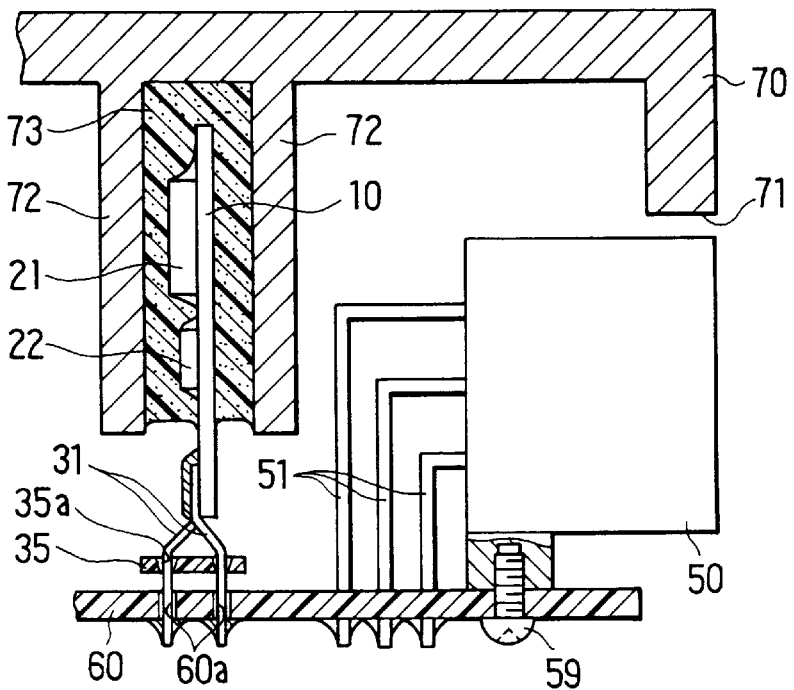
FIG. 14 is a fragmentary sectional view of a part of an electronic circuit apparatus according to another modification of the second embodiment of the present invention.

In another modification of the second embodiment, as shown in FIG. 14, any member corresponding to the heat radiating fin 40 is not used and the circuit boards 10 mounted with electronic parts 21 and 22 are inserted in a groove defined by walls 72 projecting from a case 70 to fix the circuit boards 10 in place in the groove by the heat-conductive resin 73 filled beforehand in the groove. Since the heat radiating fin 40 is unnecessary, assembling work can be reduced and the number of component parts is reduced to reduce the cost.

Figure 15:
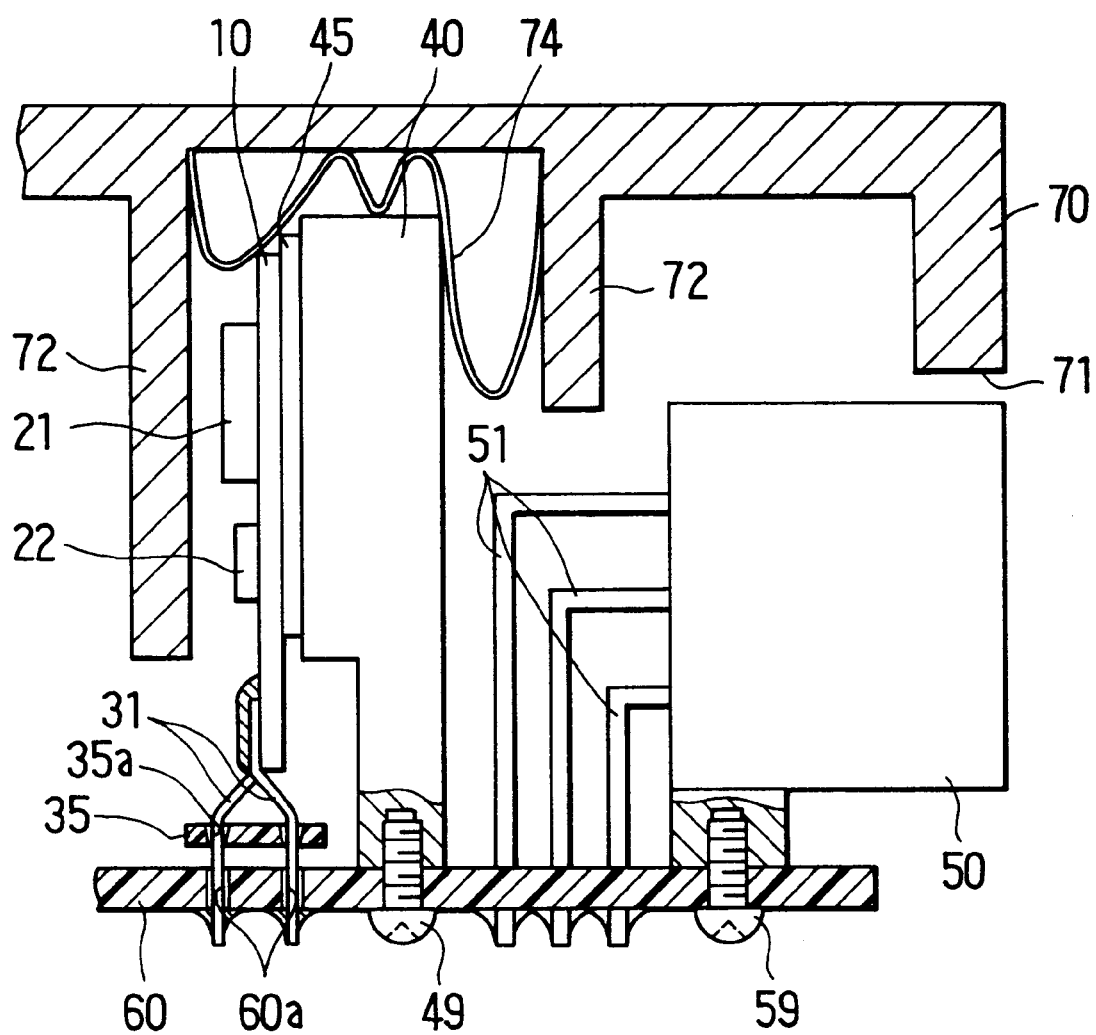
FIG. 15 is a fragmentary sectional view of a part of an electronic circuit apparatus according to a further modification of the second embodiment of the present invention.

In a further modification of the second embodiment, as shown in FIG. 15, a spring 74 is interposed between a heat radiating fin 40 to which ceramic circuit boards 10 are bonded and walls 72 projecting from a case 70 instead of filling the groove defined by the walls 72 projecting from the case 70 with the heat-conductive resin 73 in the foregoing embodiment. The spring 74 has a predetermined width and the shape of teeth of a comb, and is disposed between the walls 72. When the heat radiating fin 40 to which ceramic circuit boards 10 are bonded is inserted in the space defined by the walls, the teethlike parts of the spring 74 are distorted elastically so as to hold the heat radiating fin 40 in place. Heat generated by the electronic parts 21 and 22 and transferred to the circuit boards 10 and the heat radiating fin 40 can efficiently be transferred through the spring 74 to the walls 72 projecting from the case 70. Since the heat radiating fin 40 and such can be held in contact with the walls 72 by the resilience of the elastically distorted spring 74, stresses which may be induced in the terminals 31 of the circuit boards 10 and the motherboard 60 when assembling the electronic circuit apparatus 100, when the electronic circuit apparatus 100 is subjected to a heat cycle or when the electronic circuit apparatus 100 is vibrated can be reduced.

The present invention should not be limited to the disclosed embodiments and modifications thereof, but may be modified further without departing from the spirit of the invention. For instance, though each circuit board preferably have excellent heat radiating property and is a thick film type, a metal circuit board or epoxy resin printed circuit board may be used instead.

What is claimed is:

1. An electronic circuit apparatus comprising:
   a case having an opening;
   a plurality of circuit boards mounted with a plurality of electronic parts including heat-generative electronic parts;
   a heat radiating member joined to the circuit boards to absorb and radiate heat generated by the heat-generative electronic parts, said heat radiating member being arranged in heat conductive relation with respect to said case such that the heat radiating member transfers the heat generated by said heat-generative electronic parts to said case; and
   a motherboard electrically connected to the circuit boards and fixedly holding the heat radiating member;
   a connector unit mounted in the opening of said case;
   wherein the heat radiating member is disposed adjacent to the connector unit in said case with said plurality of circuit boards being disposed on a side of said heat radiating member opposite the connector unit.

2. The electronic circuit apparatus according to claim 1, wherein the connector unit is mounted on the motherboard for electrical connection with external wiring lines and connected to said circuit boards through the motherboard.

3. The electronic circuit apparatus according to claim 2, wherein the heat radiating member is made of metal disposed adjacent to and substantially in parallel with the connector unit.

4. The electronic circuit apparatus according to claim 3, further comprising:
a terminal arraying member provided with holes formed in an arrangement corresponding to an arrangement of terminals on the circuit boards, the terminal arraying member holding the terminals in electrically connected relation to the motherboard on said side of said heat radiating member opposite the connector unit.

5. The electronic circuit apparatus according to claim 1, wherein the circuit boards are thick-film circuit type made of highly heat-radiative material, and each circuit board is assigned to a specific function of driving a control system of an engine.

6. An electronic circuit apparatus according to claim 1, wherein the electronic parts are mounted on the circuit boards assigned to specific control functions of a vehicle different from each other, respectively.

7. The electronic circuit apparatus according to claim 6, wherein the heat-generative electronic parts are power devices for driving controlled systems of an engine of the vehicle, the circuit boards mounted with the power devices are provided with control circuits for controlling the power devices.

8. The electronic circuit apparatus according to claim 1, wherein the case has a protrusion projecting into an inside thereof, the heat radiating member has a protrusion, and both of the protrusions are in contact to transfer heat.

9. The electronic circuit apparatus according to claim 1, further comprising:
walls projecting from the case toward the motherboard to form an opening therebetween and surrounding at least a part of an area in which the electronic parts are disposed.

10. The electronic circuit apparatus according to claim 9, wherein spaces between the circuit boards and the walls are filled with a heat-conductive resin.

11. The electronic circuit apparatus according to claim 9, wherein a heat-conductive elastic member is inserted in spaces between the circuit boards and the walls.

12. An electronic circuit apparatus comprising:
circuit boards mounted with a plurality of electronic parts including heat-generative electronic parts;
a motherboard to which the circuit boards are connected electrically in a vertical position; and
a case covering the motherboard, the case having walls projecting from the case toward the motherboard in parallel with the circuit boards to form an opening therebetween and to surround at least a part of an area in which the electronic parts are disposed,
wherein spaces between the circuit boards and the walls are filled with a heat-conductive resin.

13. An electronic circuit apparatus comprising:
circuit boards mounted with a plurality of electronic parts including heat-generative electronic parts;
a motherboard to which the circuit boards are connected electrically in a vertical position; and
a case covering the motherboard, the case having walls projecting from the case toward the motherboard in parallel with the circuit boards to form an opening therebetween and to surround at least a part of an area in which the electronic parts are disposed,
wherein a heat-conductive elastic member is inserted in spaces between the circuit boards and the walls.

14. The electronic circuit apparatus according to claim 13, further comprising:
a connector unit mounted on the motherboard for an electrical connection with external wiring lines, the connector unit being disposed near and substantially in parallel with the walls.

15. A method for assembling an electronic circuit apparatus comprising:
bonding a plurality of circuit boards mounted with a plurality of electronic parts including heat-generative electronic parts to a heat radiating member with an adhesive having a high thermal conductivity;
filling a fluidic resin between a pair of walls of a case;
inserting the heat radiating member with the circuit boards thereon into the fluidic resin; and
joining the heat radiating member to a motherboard.

16. An electronic circuit apparatus comprising:
a plurality of circuit boards mounted with a plurality of electronics parts including heat-generative electronic parts;
a heat radiating member joined to the circuit boards to absorb and radiate heat generated by the electronic parts;
a motherboard electronically connected to the circuit boards and fixedly holding the heat radiating member; and
a case containing the motherboard therein, said case being set in heat conductive relation with the heat radiating member to transfer heat generated by the electronic parts through the heat radiating member; and
walls projecting toward the motherboard to form an opening therebetween and surrounding at least a part of an area in which the electronic parts are disposed;
wherein spaces between the circuit boards and the walls are filed with a heat conductive resin.

17. An electronic circuit apparatus comprising:
a plurality of circuit boards mounted with a plurality of electronics parts including heat-generative electronic parts;
a heat radiating member joined to the circuit boards to absorb and radiate heat generated by the electronic parts;
a motherboard electronically connected to the circuit boards and fixedly holding the heat radiating member; and
a case containing the motherboard therein, said case being set in heat conductive relation with the heat radiating member to transfer heat generated by the electronic parts through the heat radiating member; and
walls projecting toward the motherboard to form an opening therebetween and surrounding at least a part of an area in which the electronic parts are disposed;
a heat-conductive elastic member is inserted in spaces between the circuit boards and the walls.

* * * * *